United States Patent [19]
Hsu

[11] Patent Number: 6,080,612
[45] Date of Patent: Jun. 27, 2000

[54] METHOD OF FORMING AN ULTRA-THIN SOI ELECTROSTATIC DISCHARGE PROTECTION DEVICE

[75] Inventor: Sheng Teng Hsu, Camas, Wash.

[73] Assignees: Sharp Laboratories of America, Inc., Camas, Wash.; Sharp Kabushiki Kaisha, Osaka, Japan

[21] Appl. No.: 09/082,084

[22] Filed: May 20, 1998

[51] Int. Cl.[7] .................................................. H01L 27/14
[52] U.S. Cl. ........................ 438/202; 438/200; 438/151; 438/207; 438/330; 438/303; 438/156
[58] Field of Search .................................. 438/472, 791, 438/382, 530, 156, 151, 164, 197, 303, 200, 202, 207, 330

[56] References Cited

U.S. PATENT DOCUMENTS

| | | | |
|---|---|---|---|
| 4,997,786 | 3/1991 | Kubota et al. | 437/62 |
| 5,534,459 | 7/1996 | Kim | 437/89 |
| 5,610,790 | 3/1997 | Staab et al. | 361/156 |
| 5,880,001 | 3/1999 | Camenzind | 438/330 |
| 5,897,939 | 4/1999 | Deleonibus | 428/195 |
| 5,899,714 | 5/1999 | Farrenkopf et al. | 438/202 |
| 5,930,638 | 7/1999 | Reedy et al. | 438/382 |
| 5,953,600 | 9/1999 | Gris | 438/200 |
| 5,970,333 | 10/1999 | Gris et al. | 438/207 |

FOREIGN PATENT DOCUMENTS

| | | |
|---|---|---|
| 0 147 249 | 7/1985 | European Pat. Off. . |
| 0 797 252 | 9/1997 | European Pat. Off. . |

OTHER PUBLICATIONS

Article entitled, "ESD Reliability and Protection Schemes in SOI CMOS Output Buffers" by M. Chan, S. Yuen, Z–J Ma, K. Y. Hui, P. K. Ko and C. Hu published in the IEEE Transactions on Electron Devices, vol. 42, No. 10, Oct. 1995, pp. 1816–1821.

Article entitled, "EOS/ESD Protection Circuit Design for Deep Submicron SOI Technology" by S. Ramaswamy, P. Raha, E. Rosenbaum and S–M. Kang published in OES/ESD Symposium 95–212 to 95–217, pp. 4.7.1 to 4.7.6.

Article entitled, "Dynamic Threshold Body—and Gate–Coupled SOI ESD Protection Networks" by S. Voldman. F. Assaderaghi, J. Mandelman, L. Hsu and G. Shahidi, published in EOS/ESD Symposium, 97–210 to 97–220, pp. 3A.2.1 to 3A.2.10.

*Primary Examiner*—Matthew Smith
*Assistant Examiner*—Victor Yevsikov
*Attorney, Agent, or Firm*—David C. Ripma; Matthew D. Rabdau

[57] ABSTRACT

A method of forming, on an ultra-thin SOI substrate, an ESD protected device, includes: preparing a single crystal silicon substrate, including forming insulated areas thereon and forming selectively conductive areas thereon; doping the selectively conductive layers with dopants; growing, epitaxially, silicon layers over selected insulated areas and the doped, selectively conductive areas; heating the substrate and the structures formed thereon at between about 850° C. to 1150° C. for between about 30 minutes to three hours to redistribute the dopant into the epitaxially grown silicon layer; completing the fabrication of additional layers in the structure; and metallizing the structure.

12 Claims, 4 Drawing Sheets

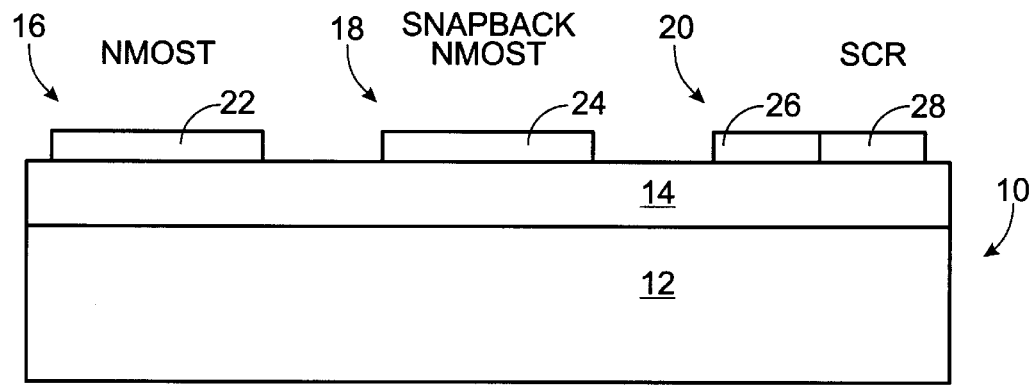
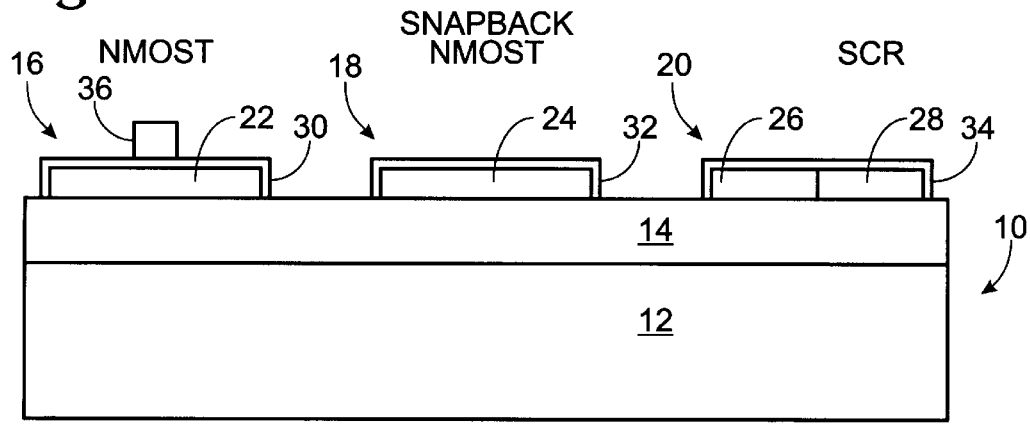

METHOD OF FORMING AN ULTRA-THIN SOI ELECTROSTATIC DISCHARGE PROTECTION DEVICE

FIELD OF THE INVENTION

This invention relates to the formation of very large scale integrated circuits (VLSI) and ultra large scale integrated circuits (ULSI) on a Silicon-on-Insulator (SOI) substrate, such as a Separation by IMplantation of Oxygen (SIMOX) substrate, and specifically to fabrication of such devices that have ample electrostatic discharge protection.

BACKGROUND OF THE INVENTION

VLSI (Very Large Scale Integration) and ULSI (Ultra Large Scale Integration) structures continue to grow in the number of individual devices which are fabricated as part of the integrated circuit, while simultaneously the device geometry is reduced, resulting in not only the reduction of the area covered by the device, but also a reduction in the thickness of the top silicon film. Known prior art electrostatic discharge (ESD) devices which are formed on the top silicon film layer are constructed as lateral devices. As a result, the active area of such ESD protected devices is reduced, resulting in poor ESD protection. In the case where the ESD protection devices are fabricated onto the substrate of the SOI wafer, the process is complicated and takes longer, which means that it costs more to fabricate such a device.

SUMMARY OF THE INVENTION

A method of forming, on an ultra-thin SOI substrate, an ESD protected device, includes: preparing a single crystal silicon substrate, including forming insulated areas thereon and forming selectively conductive areas thereon; doping the selectively conductive layers with dopants; growing, epitaxially, silicon layers over selected insulated areas and the doped, selectively conductive areas; heating the substrate and the structures formed thereon at between about 850° C. to 1150° C. for between about 30 minutes to three hours to redistribute the dopant into the epitaxially grown silicon layer; completing the fabrication of additional layers in the structure; and metallizing the structure.

It is an object of this invention to provide a thin Silicon on Insulator (SOI) ESD protected device which requires only one additional processing step.

Another object of the invention is to provide for the formation of ESD protection on ultra-shallow SOI technology, wherein the top silicon film may be no more than 10 nm in thickness.

BRIEF DESCRIPTION OF THE DRAWINGS

FIG. 1 is a front sectional elevation of an initial step in the formation of three devices on a substrate according to the invention.

FIG. 2 depicts a successive step in the formation of ESD protected devices.

DETAILED DESCRIPTION OF THE PREFERRED EMBODIMENT

Figure 3:
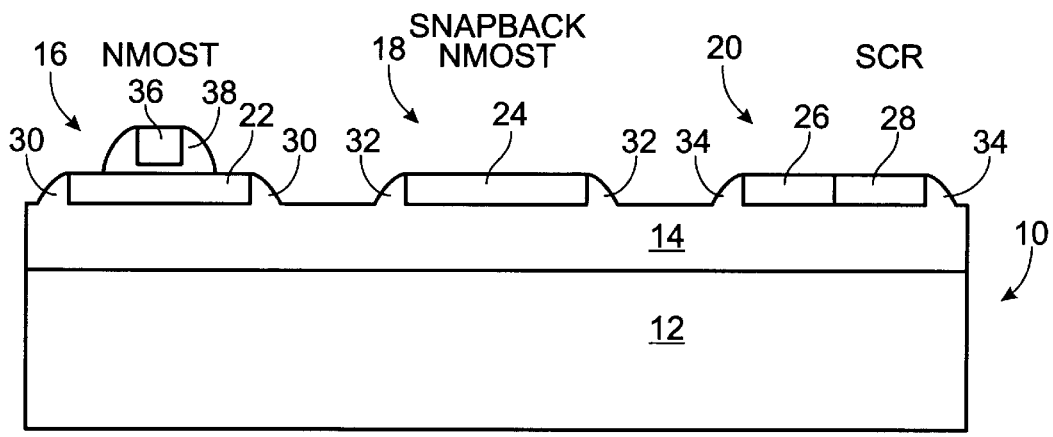
FIG. 3 depicts the configuration of the devices after an anisotropic etch of the sidewall oxide step.

The structure of devices constructed according to the invention require no special material preparation. An assumption is made that the thickness of the ultra-shallow Silicon-on-Insulator (SOI) is so thin that the device requires a raised source or drain structure. This assumption certainly holds true for the situation where the top silicon film is thinner than 50 nm, and the process does not require the silicidation of the source or drain electrodes.

Referring initially to FIG. 1, a substrate 10 which in the preferred embodiment is a Separation by IMplantation of Oxygen (SIMOX) substrate, includes a silicon layer 12, which is a single crystal silicon, and an oxide layer 14. Oxide layer 14 has a thickness of between 100 nm and 300 nm.

In the description which follows, the construction of three devices will be provided as representative of the structure and method of the invention. An nMOS transistor 16, an $n^-$ channel snapback MOS transistor 18, and a $p^+/n/p/n^+$ silicon-controlled rectifier (SCR) 20 are depicted. Other devices such as gate controlled diodes, zener diodes and bipolar transistors may also be constructed according to the method of the invention.

The substrate is initially prepared by known techniques to form active areas which are isolated from one another. This may either be by a LOCOS, or a mesa structure. LOCOS is a local oxidation process used to isolate a device area. The structure depicted in FIG. 1 shows several active areas as such will appear following mesa isolation.

Channel ion implantation, or doping, occurs next which results in the formation of an $n^-$ silicon island 26 and $p^-$ silicon islands 22, 24, and 28. In order to form the $n^-$ island, arsenic ions are implanted at an energy of between 10 keV and 50 keV, at a concentration of between $1 \cdot 10^{12}$ cm$^{-2}$ and $5 \cdot 10^{13}$ cm$^{-2}$. In order to form $p^-$ islands, $BF_2$ ions are implanted at an energy of between 10 keV and 40 keV, at a concentration of between $1 \cdot 10^{12}$ cm$^{-2}$ and $5 \cdot 10^{13}$ cm$^{-2}$. This implantation takes place to provide proper threshold voltage of between 0.3 volts and 0.7 volts for MOS transistor fabrication. Additionally, this lays the ground work for the ESD protection of the devices in a subsequent step.

Referring now to FIG. 2, gate oxidation provides an oxide layer 30, 32, and 34, also referred to herein as insulated areas, over the previously doped silicon islands. A layer of polysilicon is deposited by CVD and doped to form an $n^+$ area, which will ultimately become a gate electrode 36. In the preferred embodiment, phosphorous ions are implanted at an energy level of 40 keV and 120 keV, at a concentration of $1 \cdot 10^{15}$ cm$^{-2}$ to $1 \cdot 10^{16}$ cm$^{-2}$. Alternately, the polysilicon may be doped at the same time as source/drain ion implantation, which is a later step herein. The structure is covered with photoresist and etched to form gate electrode 36, after which, the photo resist is removed. The doped areas are also referred to herein as selectively conductive areas.

Figure 4:
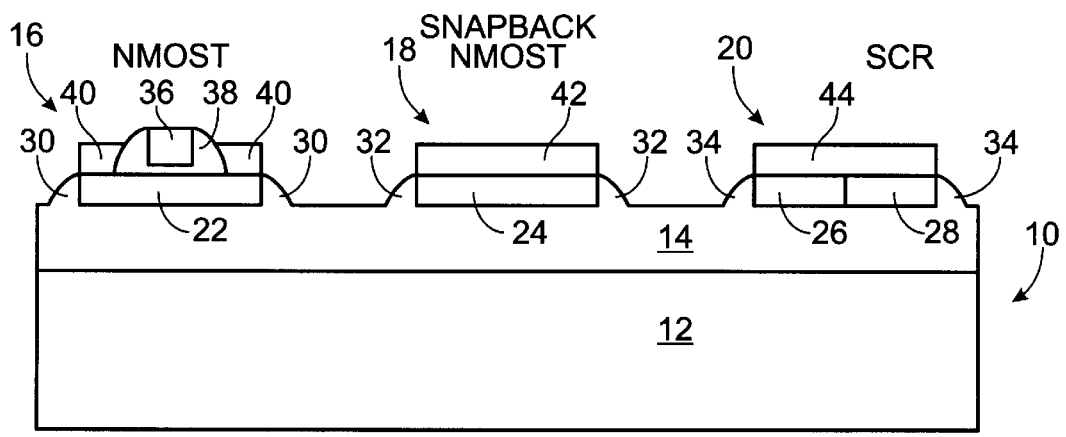
FIG. 4 is a front sectional elevation of devices constructed in accordance to the invention after a step of selective epitaxial silicon growth.
Figure 5:
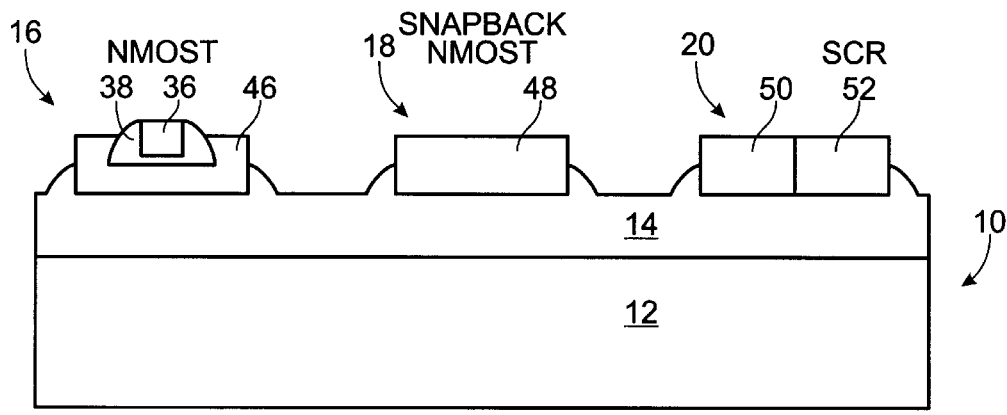
FIG. 5 is a front sectional elevation of the devices constructed according to the invention after the silicon layers have been properly doped.

Referring now to FIG. 3, oxide layer 38 is deposited by CVD and is anisotropically etched to form sidewall oxide about polysilicon gate 36. Silicon layers 40, 42, and 44 (FIG. 4) are grown by selective epitaxial methods, which grows the silicon only onto other silicon and polysilicon layers. The newly grown layers of silicon are not doped.

The next step in the formation of the ESD protected devices is diffusion. This is the only additional process step required for the ESD device fabrication of the invention. The structure is heated at a temperature of between 850° C. to 1150° C. from between 30 minutes to three hours. This redistributes the doping in silicon islands 22, 24, 26, and 28 into the epitaxial deposited silicon layers 40, 42, and 44, resulting in doped silicon areas 46, which is a combination of previously identified areas 22 and 40, area 48 which is a combination of previously identified areas 24 and 42, area 50 which is a combination of previously identified areas 26 and 44, and area 52 which is a combination of previously identified areas 28 and 44. The total dopant in the channel region will be on the order of $1 \cdot 10^{12}$ cm$^{-2}$. Therefore, if the dopant is uniformly distributed, the doping density of the top silicon and the epitaxial silicon layer will be on the order of $5 \cdot 10^{16}$ cm$^{-3}$ to $10 \cdot 10^{17}$ cm$^{-3}$.

Figure 6:
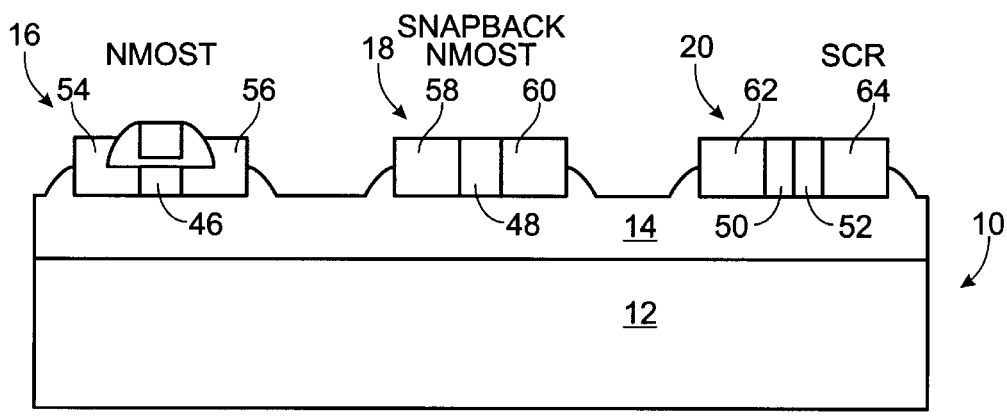
FIG. 6 is a front sectional elevation of the devices constructed according to the invention after $n^+$ and $p^+$ ion implantation.
Figure 7:
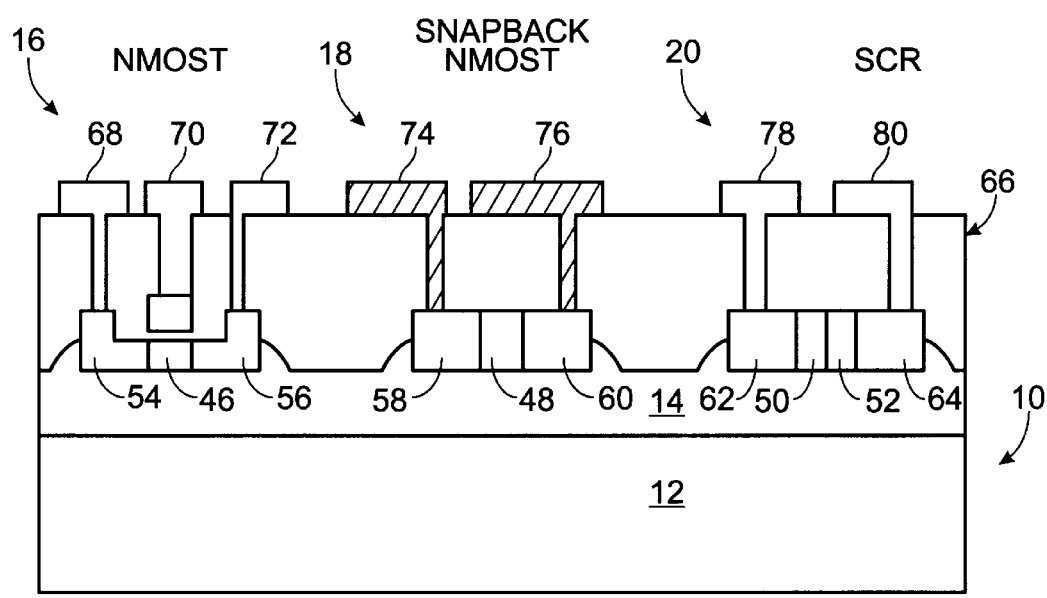
FIG. 7 is a front sectional elevation showing representative samples of ESD protected devices formed according to the invention.

Referring to FIGS. 6 and 7, additional layers and structure are fabricated, completing the fabrication of additional layers in the structure. In the case of the three devices being described, the structure is covered with photoresist to mask for n$^+$ and p$^+$ ion implantation, resulting in n$^+$ areas 54, 56, n$^+$ areas 58, 60, and a p$^+$ area 62 and an n$^+$ area 64.

Next, an oxide layer 66 is deposited by CVD over the entire structure. The structure is covered with photoresist to provide the etching for contact holes and metalization, resulting in metal contacts 68,70,72,74,76,78, and 80, as shown in FIG. 7. It should be noted that in the case of snapback nMOS 18, the metal gate device has a single electrode connected to the gate and the source thereof.

The current handling capacity of a pn junction of this structure is:

$$1 + \frac{T_{epi}}{T_{TopSi}}$$

times larger than the prior art structure. In the case of a 25 nm top silicon film having a 100 nm thick selective EPI layer, the current handling capacity of the device is 5 times larger than that of the prior art structure made on the same surface area. A thicker selective epitaxial layer may be used if larger protection or smaller ESD device area is required.

Although only the snapback nMOS and SCR area shown here, all other ESD devices may be fabricated by the addition of the diffusion step as described herein. In the event that a salicide process is required, an additional mask must be used in order to prevent the silicidation of the ESD device. If properly fabricated, the series resistance for a 100 nm selective EPI raised source/drain process is low enough that the salicide process does not significantly increase the device performance.

Although a preferred embodiment of the method of the invention has been disclosed, it will be appreciated that further modifications and variations thereto may be made without departing from the scope of the invention as defined in the appended claims.

I claim:

1. A method of forming, on an ultra-thin SOI substrate, an ESD protected device, comprising:
   preparing isolated active areas on a single crystal silicon substrate, including forming insulated areas thereon isolating the active areas from one another;
   doping the isolated active areas with dopants to form selectively conductive areas in the isolated active areas;
   growing, epitaxially, a silicon layer over selected areas of each isolated active area; and
   after growing the silicon layer over the isolate active areas, heating the substrate to redistribute the dopant from the doped, selectively conductive areas of each isolated active area throughout the epitaxially grown silicon layer resulting in doped silicon areas which are a combination of the doped selectively conductive areas and the epitaxially grown silicon to increase the current handling capacity of the combined areas, whereby ESD protection is provided for active devices formed on the substrate.

2. The method of claim 1 wherein said step of heating the substrate after growing the silicon layer includes heating at between about 850° C. to 1150° C. for between about 30 minutes to three hours.

3. The method of claim 1 wherein said doping step includes implanting BF$_2$ ions in the areas selected to form p-conductivity type areas at an energy of between about 10 keV and 40 keV, at a dose of between about $1 \cdot 10^{12}$ cm$^{-2}$ to $5 \cdot 10^{13}$ cm$^{-2}$, and where the doping density of ions in the epitaxially grown silicon layer areas which are combined with the areas implanted with BF$_2$ ions, following the heating step to redistribute the dopant, is between about $5 \cdot 10^{16}$ cm$^{-3}$ to $10 \cdot 10^{17}$ cm$^{-3}$.

4. The method of claim 1 wherein said doping step includes implanting arsenic ions in the areas selected to form n-conductivity type areas at an energy of between about 10 keV and 50 keV, at a dose of between about $1 \cdot 10^{12}$ cm$^{-2}$ to $5 \cdot 10^{13}$ cm$^{-2}$.

5. The method of claim 1 including, on selected isolated active areas where MOS transistors are formed, before the step of doping the isolated active areas of the single crystal silicon substrate with dopants, the step of forming a gate electrode and sidewalls.

6. A method of forming, on an ultra-thin SOI substrate, an ESD protected device, comprising:
   preparing isolated active areas on a single crystal silicon substrate, including forming insulated areas thereon isolating the active areas from one another;
   doping the isolated active areas with dopants to form selectively conductive areas in the isolated active areas;
   growing, epitaxially, a silicon layer over selected areas of each isolated active area; and
   after growing the silicon layer over the isolate active areas, heating the substrate at between about 850° C. to 1150° C. for between about 30 minutes to three hours to redistribute the dopant from the doped, selectively conductive areas of each isolated active area throughout the epitaxially grown silicon layer resulting in doped silicon areas which are a combination of the doped selectively conductive areas and the epitaxially grown silicon to increase the current handling capacity of the combined areas, whereby ESD protection is provided for active devices formed on the substrate.

7. The method of claim 6 wherein said doping step includes implanting BF$_2$ ions in the areas selected to form p-conductivity type areas at an energy of between about 10 keV and 40 keV, at a dose of between about $1 \cdot 10^{12}$ cm$^{-2}$ to $5 \cdot 10^{13}$ cm$^{-2}$, and where the doping density of ions in the epitaxially grown silicon layer areas which are combined with the areas implanted with BF$_2$ ions, following the heating step to redistribute the dopant, is between about $5 \cdot 10^{16}$ cm$^{-3}$ to $10 \cdot 10^{17}$ cm$^{-3}$.

8. The method of claim 6 wherein said doping step includes implanting arsenic ions in the areas selected to form n-conductivity type areas at an energy of between about 10 keV and 50 keV, at a dose of between about $1 \cdot 10^{12}$ cm$^{-2}$ to $5 \cdot 10^{13}$ cm$^{-2}$.

9. The method of claim 6 including, on selected isolated active areas where MOS transistors are formed, before the step of doping the isolated active areas of the single crystal silicon substrate with dopants, the step of forming a gate electrode and sidewalls.

10. An improved method of forming ESD protected devices, wherein a single crystal silicon substrate, on which insulated areas are formed to isolate active areas from one another, provides isolated active areas of single crystal silicon where the ESD protected devices are formed: the isolated active areas being doped with dopants to form selectively conductive areas in the isolated active areas; the improvement comprising:

growing a silicon layer epitaxially over selected areas of each isolated active area of single crystal silicon; and then heating the substrate to redistribute the dopant from the doped, selectively conductive areas of each isolated active area throughout the epitaxially grown silicon layer whereby the doped selectively conductive areas combine with the epitaxially grown silicon layer to increase the current handling capacity of the combined areas.

11. The method of claim 10 wherein said step of heating the substrate includes heating at between about 850° C. to 1150° C. for between about 30 minutes to three hours.

12. The method of claim 10 wherein the doping of the isolated active areas of the substrate includes implanting BF$_2$ ions in the areas selected to form p-conductivity type areas in the active areas at an energy of between about 10 keV and 40 keV, at a dose of between about $1 \cdot 10^{12}$ cm$^{-2}$ to $5 \cdot 10^{13}$ cm$^{-2}$, and where the step of heating the substrate redistributes the dopants to provide a doping density of ions in the doped selectively conductive areas and the epitaxially grown silicon layer areas which are combined with the implanted areas is between about $5 \cdot 10^{16}$ cm$^{-3}$ to $10 \cdot 10^{17}$ cm$^{-3}$.

* * * * *